United States Patent
Villa et al.

(10) Patent No.: US 6,559,035 B2
(45) Date of Patent: May 6, 2003

(54) METHOD FOR MANUFACTURING AN SOI WAFER

(75) Inventors: Flavio Villa, Milan (IT); Gabriele Barlocchi, Cornaredo (IT); Pietro Montanini, Melegnano (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/068,108

(22) Filed: Feb. 5, 2002

(65) Prior Publication Data

US 2002/0094665 A1 Jul. 18, 2002

Related U.S. Application Data

(63) Continuation of application No. 09/229,597, filed on Jan. 12, 1999, now abandoned.

(30) Foreign Application Priority Data

Jan. 13, 1998 (EP) .............................. 98830007
Apr. 3, 1998 (EP) .............................. 98830206

(51) Int. Cl.⁷ .............................. H01L 21/36
(52) U.S. Cl. .............................. 438/481
(58) Field of Search .............................. 438/481, 478–480, 438/311, 39, 41, 164, 404, 412

(56) References Cited

U.S. PATENT DOCUMENTS 4,361,600 A   11/1982   Brown .............................. 427/93

(List continued on next page.)

FOREIGN PATENT DOCUMENTS

| EP | 0 223 694 | 5/1987 |
| EP | 0 226 091 | 6/1987 |
| EP | 0 488 344 | 6/1992 |
| FR | 2 489 041 | 2/1982 |
| GB | 2 156 149 | 10/1985 |
| JP | 0 130 724 1 | 12/1989 |
| JP | 0 534 332 0 | 12/1993 |

OTHER PUBLICATIONS

Zorinsky et al., "The 'Islands' Method—A Manufacturable Porous Silicon SOI Technology," *IEEE*, 2:431–434, 1986.
Haisma, J., "SOI Technologies: Their Past, Present and Future," *Journal de Physique* 49(9):C4–3–C4–12, Sep. 1988.
Haisma, J., et al., "Silicon–on–Insulator Bonding–Wafer Thinning Technological Evaluations," *Japanese Journal of Applied Physics* 28(8):1426–1443, Aug. 1989.
Kakoschke, R. et al., "Trench Sidewall Implantation with a Parallel Scanned ION Beam," *IEEE Trans. Elec. Dev*, pp. 1–9, Nov. 1989.
Murari, B., Bertotti, F. Vignola, G.A. (Eds.), *Smart Power Ics*, pp. 20–21, Springer, New York, 1995.
Yasseen, A. et al., "Chemical–Mechanical Polishing for Polysilicon Surface Micromachining," *J. Electrochem. Soc.* 144(1):237–242, Jan. 1997.
French et al., "Epi–Micromachining," *Microelectronics Journal*, 28:449–464, 1997.

\* cited by examiner

*Primary Examiner*—Carl Whitehead, Jr.
*Assistant Examiner*—Craig Thompson
(74) *Attorney, Agent, or Firm*—Lisa K. Jorgenson; Robert Iannucci; Seed Ip Law Group PLLC

(57) ABSTRACT

Method for manufacturing an SOI wafer. On a monocrystalline silicon wafer, forming protective regions having the shape of an overturned U, made of an oxidation resistant material, the protective regions covering first wafer portions. Forming deep trenches in the wafer which extend between, and laterally delimit the first wafer portions, completely oxidizing the first wafer portions except their upper areas which are covered by the protective regions, to form at least one continuous region of covered oxide overlaid by the non-oxidized upper portions. Removing the protective regions, and epitaxially growing a crystalline semiconductor material layer from the non-oxidized upper portions.

26 Claims, 7 Drawing Sheets

U.S. PATENT DOCUMENTS

| | | | |
|---|---|---|---|
| 4,563,227 A | 1/1986 | Sakai et al. | 148/187 |
| 4,704,186 A | 11/1987 | Jastrzebski | 156/612 |
| 4,760,036 A | 7/1988 | Schubert | 437/90 |
| 4,845,048 A | 7/1989 | Tamaki et al. | 437/62 |
| 4,910,165 A | 3/1990 | Lee et al. | 437/90 |
| 4,948,456 A | 8/1990 | Schubert | 156/611 |
| 5,115,289 A | 5/1992 | Hisamoto et al. | 357/23.7 |
| 5,208,167 A | 5/1993 | Nakamura | 437/21 |
| 5,336,633 A | 8/1994 | Tsuruta | 437/62 |
| 5,382,534 A | 1/1995 | Sheu et al. | 437/35 |
| 5,635,411 A | 6/1997 | Takasu | 438/311 |
| 5,712,205 A | 1/1998 | Park et al. | 438/425 |
| 5,877,092 A | 3/1999 | Lee et al. | 438/738 |
| 6,013,937 A | 1/2000 | Beintner et al. | 257/513 |
| 6,350,657 B1 * | 2/2002 | Mastromatteo et al. | 438/311 |
| 6,362,070 B1 * | 3/2002 | Villa et al. | 438/404 |
| 6,455,391 B1 * | 9/2002 | Villa et al. | 438/370 |

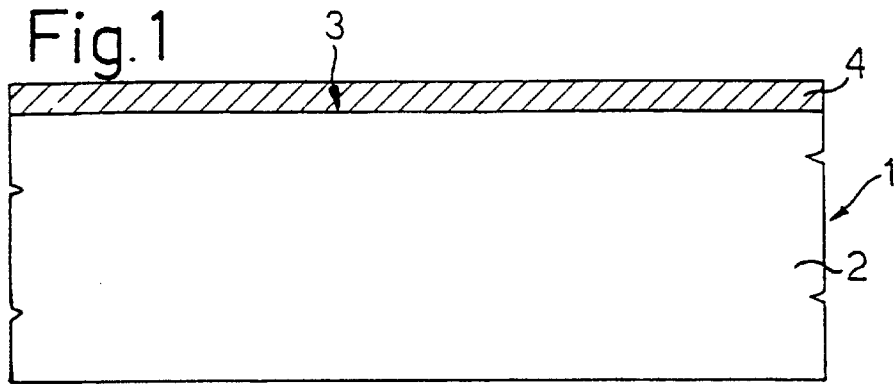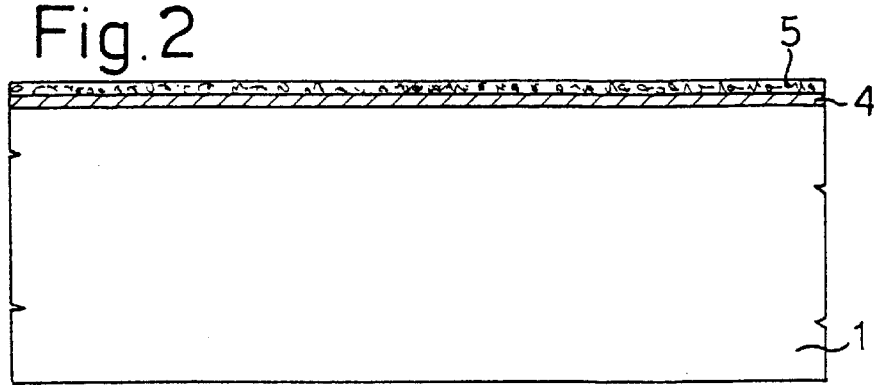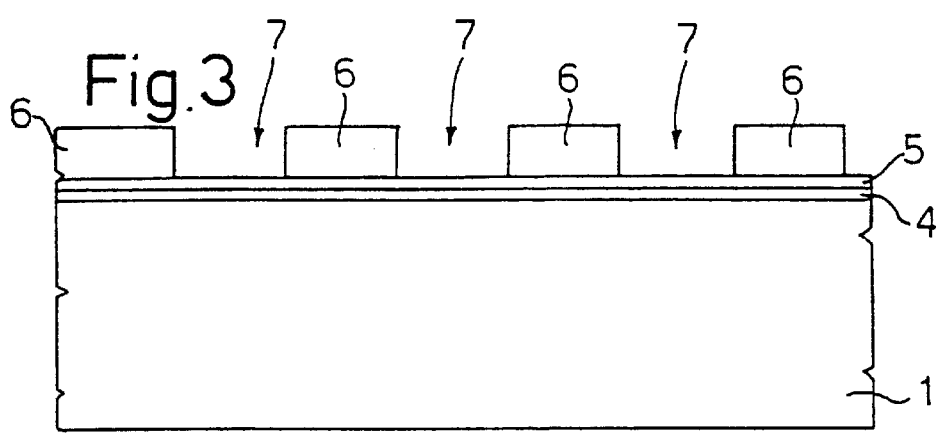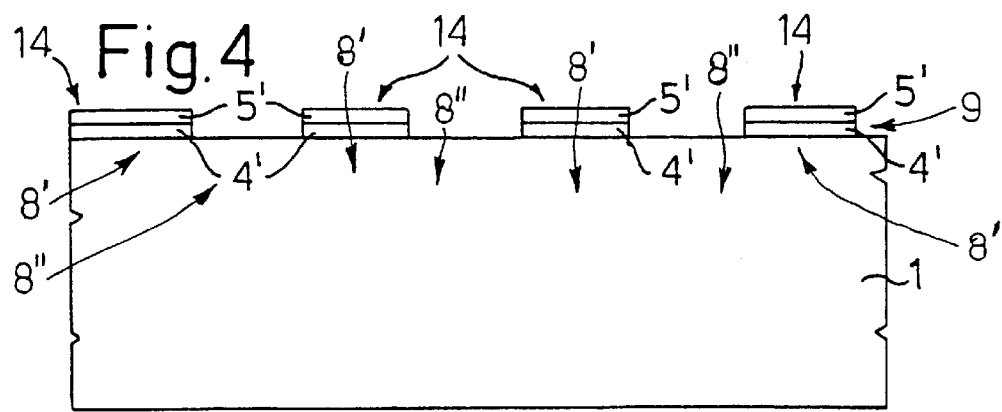

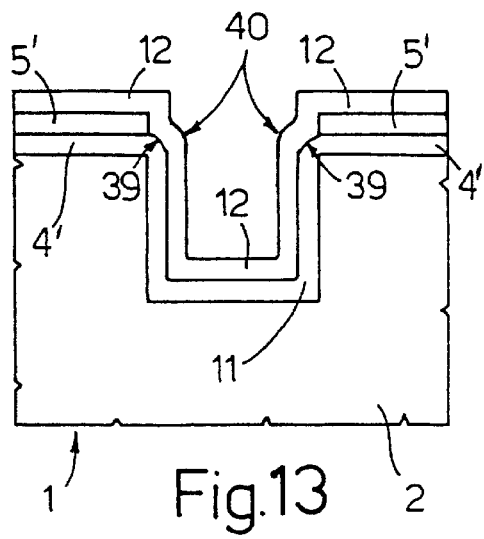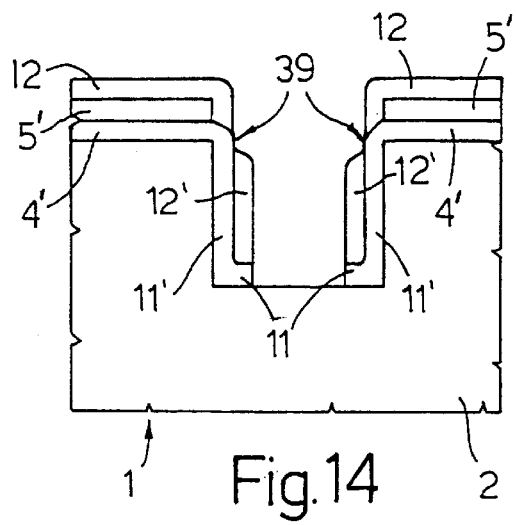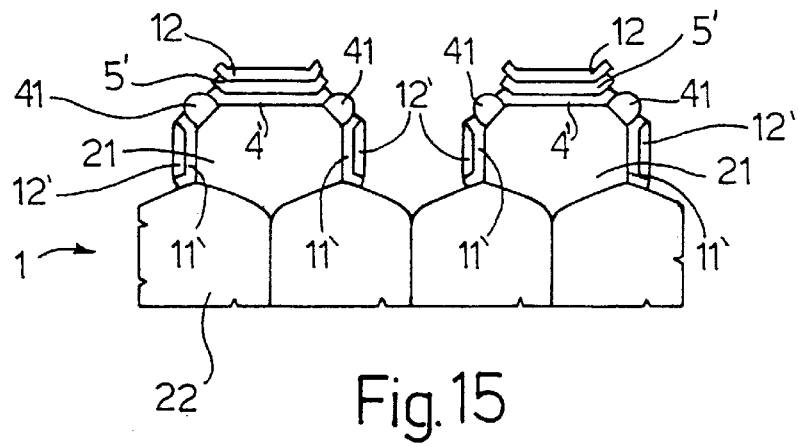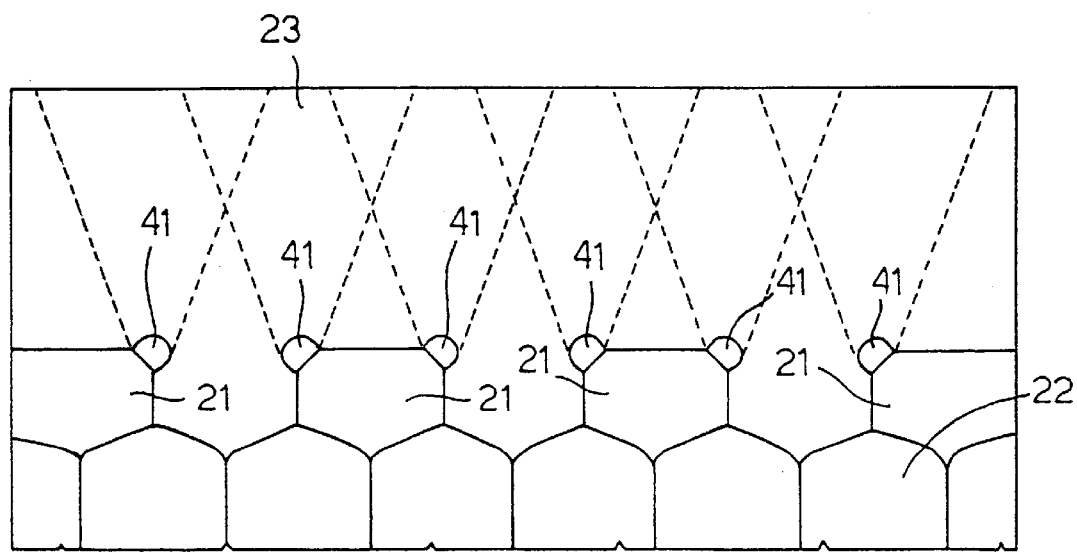

METHOD FOR MANUFACTURING AN SOI WAFER

CROSS-REFERENCE TO RELATED APPLICATION

This application is a continuation of U.S. patent application Ser. No. 09/229,597, filed Jan. 12, 1999, now abandoned, which application is incorporated herein by reference in its entirety.

BACKGROUND OF THE INVENTION

1. Field of the Invention

The present invention relates to a method for manufacturing an SOI wafer.

2. Description of the Related Art

According to current processes known in the microelectronics industry, the substrate of integrated devices is obtained from wafers of monocrystalline silicon. In the last few years, as an alternative to wafers consisting of silicon alone, composite wafers, so-called "SOI" (Silicon-on-Insulator) wafers have been proposed, comprising two silicon layers, one of which is thinner than the other, separated by a silicon oxide layer (see for example the article "Silicon-on-Insulator Wafer Bonding—Wafer Thinning Technological Evaluations" by J. Hausman, G. A. Spierings, U. K. P. Bierman and J. A. Pals, Japanese Journal of Applied Physics, Vol. 28, No. 8, August 1989, pp. 1426–1443).

Considerable attention has recently been paid to SOI wafers, since integrated circuits having a substrate formed from wafers of this type have considerable advantages compared with similar circuits formed on conventional substrates, formed by monocrystalline silicon alone. These advantages can be summarized as follows:

a) faster switching speed;

b) greater immunity to noise;

c) smaller loss currents;

d) elimination of parasitic component activation phenomena (latch-up);

e) reduction of parasitic capacitance;

f) greater resistance to radiation effects; and g) greater component packing density.

A typical process for manufacturing SOI wafers is described in the aforementioned article, and is based on bonding two monocrystalline silicon wafers (wafer bonding process). In particular, according to this process, one wafer is oxidized, and after cleaning operations, it is bonded to the other wafer. After a thermal annealing step, the outer surface of the oxidized wafer is submitted to surface grinding, polishing until the required thickness is obtained (for example 1 μm), and buffing. An epitaxial layer, integrating electronic components, is subsequently optionally grown on the thinner monocrystalline silicon layer.

The wafers obtained by the conventional wafer bonding method have excellent electrical features, but have undeniably high costs (approximately six times greater than the cost of the standard substrates).

Other methodologies, such as ZHR, SIMOX, etc., are described in the article "SOI Technologies: Their Past, Present and Future" by J. Haisha, Journal de Physique, Colloque C4, Supplément á no. 9, Tome 49, September 1988. These latter techniques have also not yet reached an acceptable industrial level, and have some limitations. In fact, they do not allow obtainment of monocrystalline silicon layers on extensive oxide areas, they have a high defect level owing to displacements generated by stresses induced by the covered oxide, or they do not allow application of high voltages as with SIMOX technology, wherein the oxide thickness obtained by oxygen implant is approximately 100–200 nm.

BRIEF SUMMARY OF THE INVENTION

The present invention provides a process for manufacturing an SOI wafer which exploits at least some of the inherent advantages of these technologies, but at competitive costs with respect to standard, fully monocrystalline substrates now being used.

On a wafer of monocrystalline semiconductor material, first protective regions of an oxidation resistant material are formed, covering first wafer portions. Deep trenches are formed in said wafer, extending between and laterally delimiting said first wafer portions. Said first wafer portions are oxidized, except upper portions, forming at least one continuous region of covered oxide overlaid by said non-oxidised upper portions, and covered by said first protective regions. Said first protective regions are removed, and a crystalline semiconductor material layer is epitaxially grown from said upper portions.

BRIEF DESCRIPTION OF THE SEVERAL VIEWS OF THE DRAWING(S)

FIGS. 1–10 show cross-sections of an SOI wafer in manufacturing processes according to a first embodiment of the present invention.

FIGS. 13–16 show cross-sections of an SOI wafer during manufacturing processes according to the first embodiment of the invention.

DETAILED DESCRIPTION OF THE INVENTION

Figure 5:
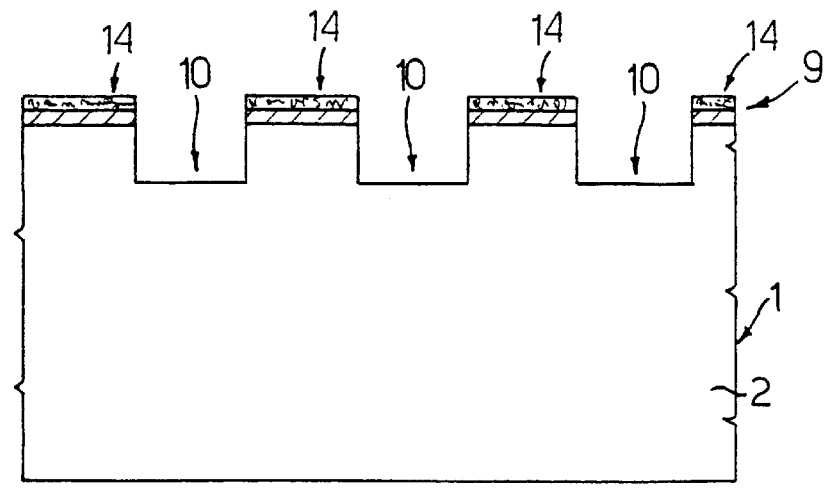

As shown in FIG. 1, a wafer 1, formed by a monocrystalline silicon region 2, is initially subjected to oxidation to grow, on one of its surfaces 3, a first silicon oxide layer 4, with a thickness for example, of approximately 200 to 600 Å.

As shown in FIG. 2, on the first oxide layer 4, a first silicon nitride layer 5 is deposited with a thickness for example, of approximately 900 to 1500 Å. As shown in FIG. 3, on the first nitride layer 5, a resist layer is deposited, and the latter is etched such as to form a resist mask 6, comprising regions delimited by apertures 7, which leave uncovered selective portions of first nitride layer 5. The apertures 7 are advantageously in the form of strips extending in a perpendicular direction to the sheet, are typically spaced from one another by approximately 1 μm, and typically have a width of 1 to 2 μm. Alternatively they form a grid, and the regions forming resist mask 6 may have any form, for example they can be square, rectangular, hexagonal or polygonal.

Using resist mask 6, uncovered portions of first nitride layer 5 and first oxide layer 4 are dry etched, leaving portions of these layers indicated at 5a and 4a; resist mask 6 is then removed, and the intermediate structure in FIG. 4 is obtained, in which remaining portions 4a and 5a define respective first protective regions 14 which cover first portions 2a of the monocrystalline silicon region 2 and form a hard mask 9.

Figure 6:
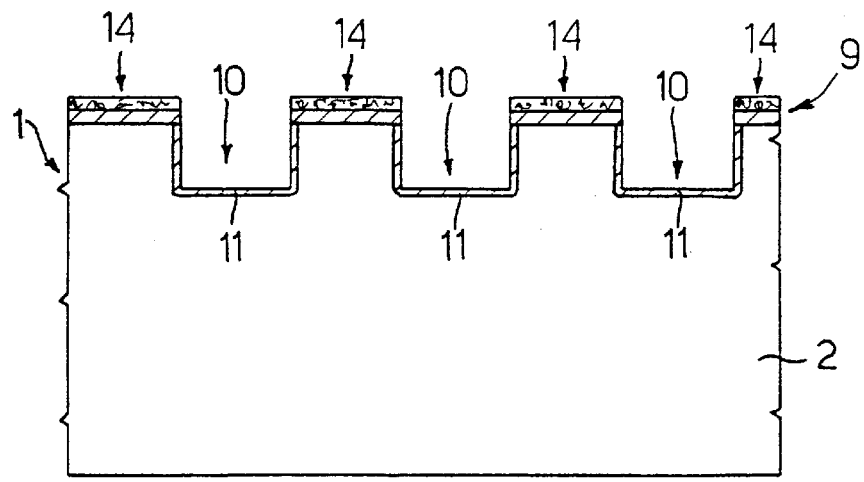
Figure 7:
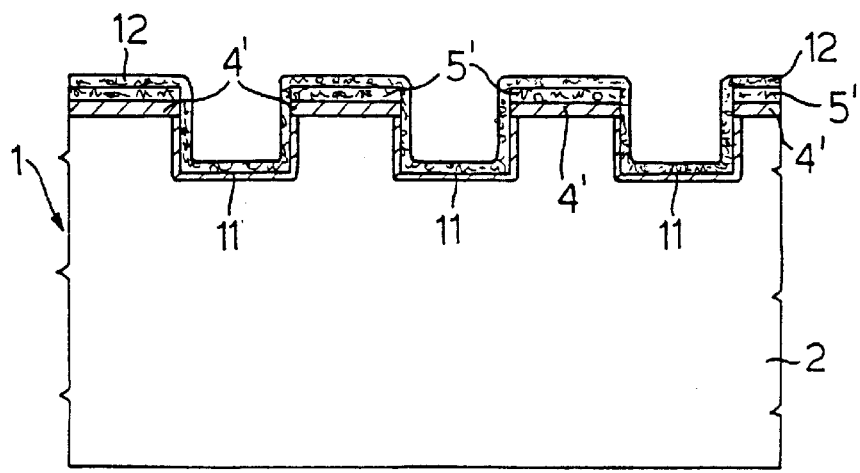

With reference to FIGS. 4 and 5, using hard mask 9, monocrystalline silicon region 2 is then etched at second portions 2b not covered by the hard mask 9, forming initial trenches 10, the shape, width and spacing whereof corresponds to that of apertures 7 (FIG. 3), and the depth of which is typically 0.5 to 5 µm, depending on the required characteristics for the covered oxide layer to be produced, as explained hereinafter. Other depths may also be used as appropriate. Subsequently, as shown in FIG. 6, wafer 1 is submitted to oxidation, thus forming a second oxide layer 11 covering the walls and base of initial trenches 10. The second oxide layer 11 has a thickness of, for example, 200 to 600 Å. As shown in FIG. 7, a second silicon nitride layer 12 is deposited, with a thickness of approximately 900 to 1500 Å, and layers 12 and 11 are anisotropically etched without mask. Owing to anisotropy of etching, the horizontal portions are removed from second silicon nitride 12 and oxide 11 layers on the base of initial trenches 10, and above portions 4a, 5a, resulting in the intermediate structure in FIG. 8 wherein the first portions 2a of the monocrystalline silicon of region 2 remain covered above by the hard mask 9 (oxide 4a and nitride 5a portions) and laterally (on the vertical walls of initial trenches 10) by portions 11a and 12a of oxide and nitride. Monocrystalline silicon region 2 is exposed on the bottom 15 of the initial trenches 10.

Figure 9:
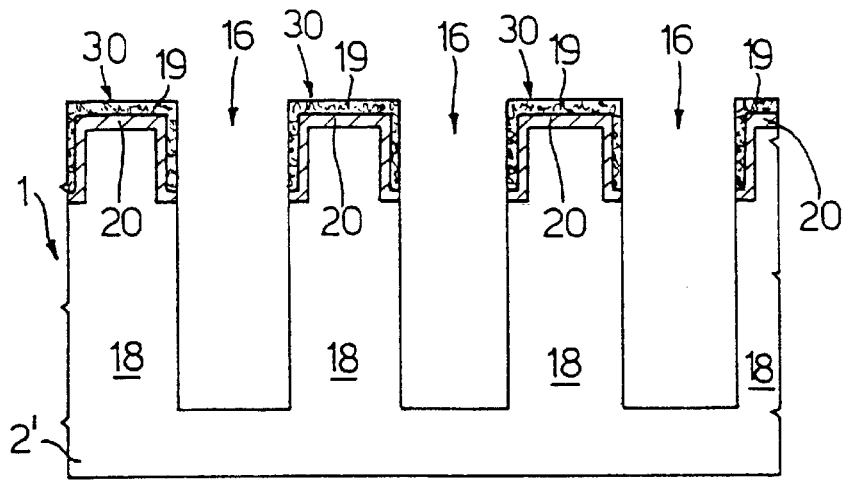

The uncovered silicon is then etched at bottom 15 of initial trenches 10, in order to deepen initial trenches 10 until final trenches or recesses 16 of the required depth are obtained. In particular, the depth of final trenches 16 (like that of initial trenches 10) determines the dimensions of the covered oxide layer, and thus the electrical characteristics of the SOI wafer, as explained hereinafter. The depth of the final trenches 16 is therefore determined on the basis of the specifications provided for the final SOI wafer. At this stage in the processing, the monocrystalline silicon region comprises a base portion 2c, and a plurality of "columns" 18, extending vertically from base portion 2c, the shape whereof corresponds substantially to that of resist region 6 (FIG. 3). This thus provides the intermediate structure of FIG. 9, wherein nitride portions 5a and 12a are no longer separated from each other and are indicated at 19, and oxide portions 4a and 11a are no longer separated from each other, are indicated at 20, and, together with portions 19, form second protective regions 30.

Figure 7A:
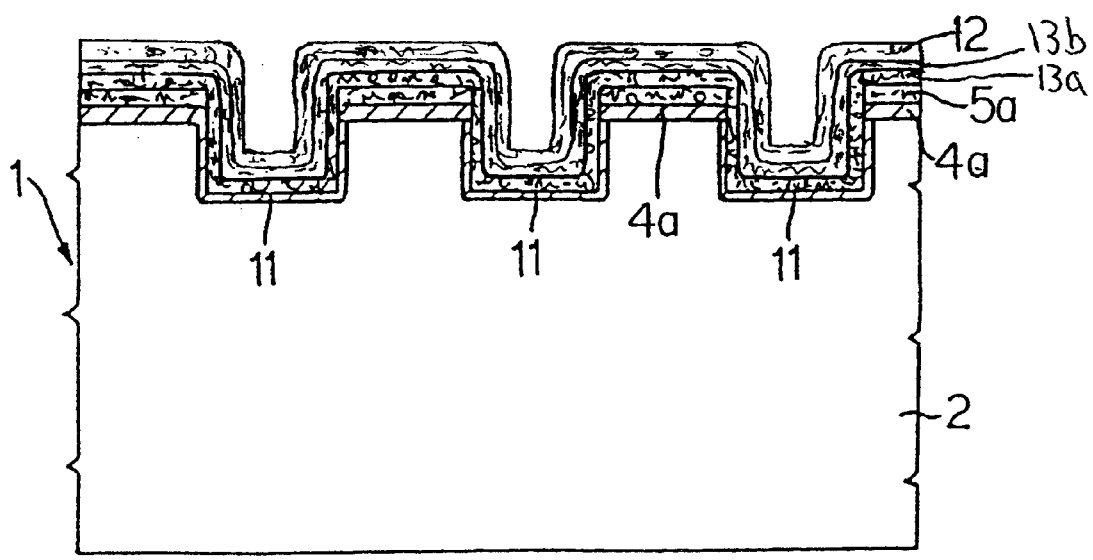
Figure 10:
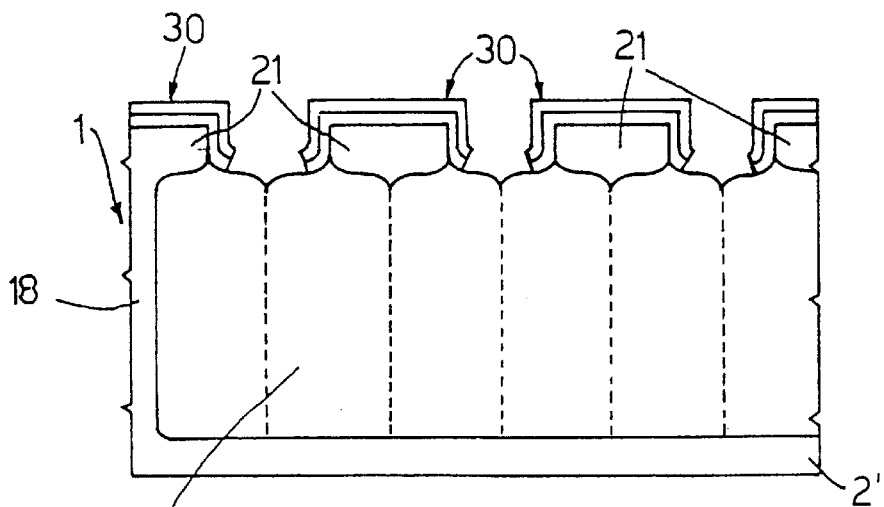

An oxidation step is then carried out, such that the exposed silicon regions of "columns" 18 are transformed into silicon oxide. In practice, there is gradual growth of oxide regions, to the detriment of silicon regions, starting from lateral walls of final trenches 16, towards the interior of the columns, and partly also towards and inside base portions 2c. Since during oxidation there is an increase in volume, the oxide regions being formed gradually occupy the space of the final trenches 16, until they close the latter completely and join to another. The oxidation step ends automatically when columns 18 have been completely oxidized (apart from the upper area or tip 21, which is protected by second protective regions 30), forming a continuous covered oxide region 22, shown in FIG. 10, wherein broken lines indicate the contacting surfaces of the oxide regions being formed from walls of two adjacent final trenches 16, to show the oxide growing phenomenon. The form of covered oxide region 22, which now forms a continuous layer, can be regulated in a known manner by previously carrying out angle implantation (after creation of the final trenches 16), such as to obtain during oxidation a high volume growth for doped regions, which is greater than in case of intrinsic regions (concerning this technique, see for example the article "Trench Sidewall Implantation with a Parallel Scanned Ion Beam" by R. Kakoschke, R. E. Kaim, P. F. H. M. Van Der Meulen, J. F. M. Westendorp, IEEE Trans. Elec. Dev., November 1989). In addition to, or as an alternative to angle implantation, the form of oxide can also be regulated by using a buffered local oxidation step (poly-buffered LOCOS, as described for example in the text "Smart Power ICs—Technologies and Applications" by B. Murari, F. Bertotti, G. A. Vignola, Springer, page 21, FIG. 1.21), i.e., by depositing two polysilicon layers 13a, 13b (FIG. 7A) between layers 11 and 12, when forming a polycrystalline silicon region between oxide portions 20 and nitride portions 19. Thus, the structure of FIG. 10 is obtained, wherein only a portion of column 18 remains furthest to the left, ending in an upper portion 21.

Figure 11:
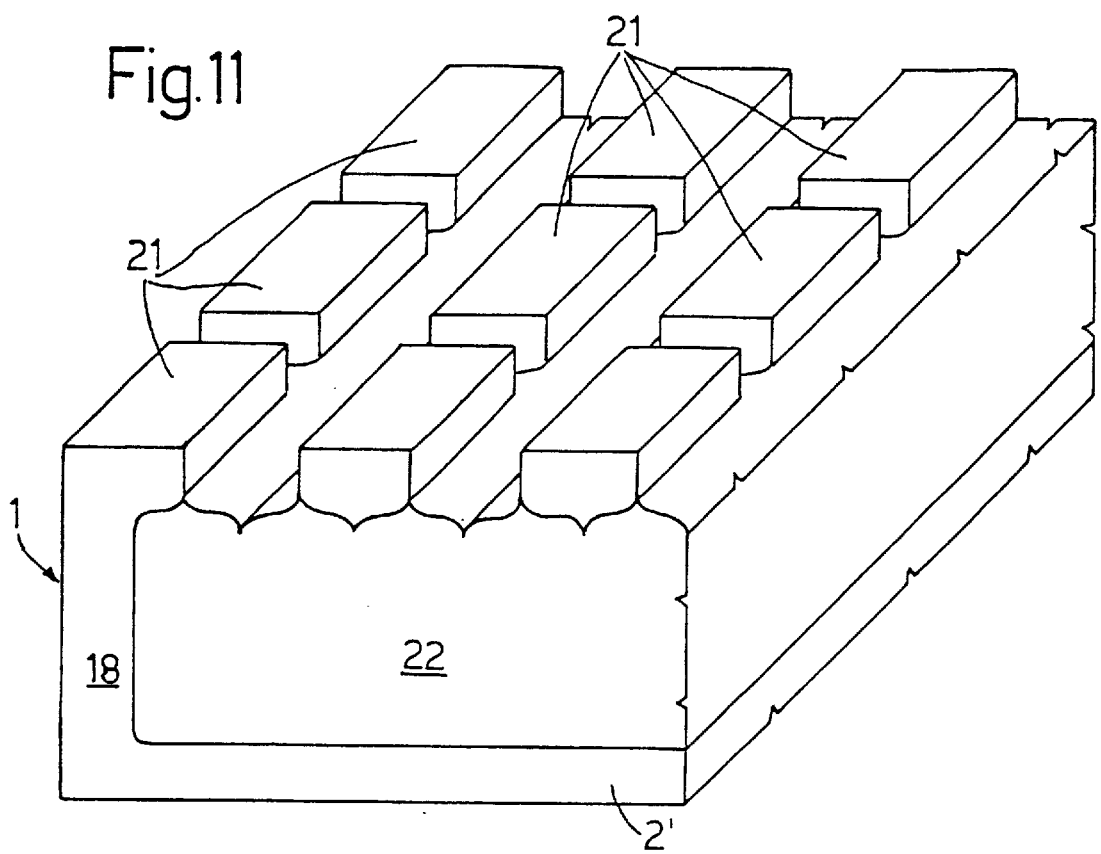
FIGS. 11 and 12 show perspective cross-sections in two manufacturing processes according to the first embodiment of the invention.

Subsequently, by selective etching, second protective regions 30 are eliminated such as to uncover "tips" 21 which are intended to form the nuclei for a subsequent epitaxial growth step. The structure of FIG. 11 is obtained, which shows the three-dimensional structure of wafer 1 in this step, for a grid-shaped mask 6, as already described with reference to FIG. 3. Subsequently, epitaxial growth is carried out, the parameters of which are selected such as to prevent nucleation of silicon in the areas above oxide region 22. A high ratio of lateral to vertical growth is selected, to obtain initially horizontal growth of silicon around tips 21, thus covering the upper surface of covered oxide region 22, and vertical growing of an epitaxial layer 23. After an optional chemical-mechanical polishing step (as described for example in the article "Chemical Mechanical Polishing for Polysilicon Surface Micromachining" by A. A. Yasseen, N. J. Mourlas and M. Mehregany, J. Electrochem. Soc. vol. 144, No. 1, January 1997), in order to level the upper surface of wafer 1, the final structure of the wafer 1 shown in FIG. 12 is obtained.

Subsequently, for example during production of electronic components, heat treatment steps can be carried out to eliminate stresses induced by the covered oxide.

Figure 12:
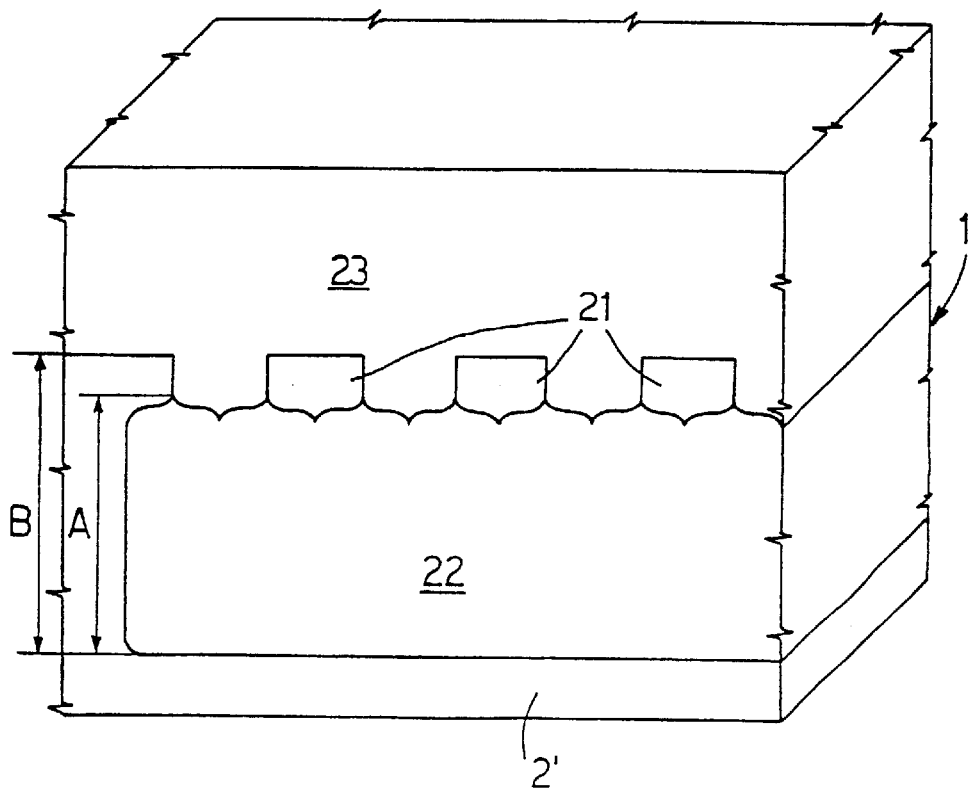

In the structure of FIG. 12, the dimensions A (thickness of covered oxide region 22) and B (depth of covered oxide region relative to upper monocrystalline region formed by epitaxial layer 23 and "tips" 21) can be regulated within extensive limits by modifying the depth of initial trenches 10 (and thus the depths of the vertical walls of protective regions 30), and of final trenches 16. The depth of the covered oxide layer 22 depends on the depth of the final trenches 16, and the difference between the depths of final trenches 16 and that of initial trenches 10 determines the thickness of the covered oxide layer. Thereby, in case of A<B, it is possible to obtain a thick oxide layer, and, in the case of A>>B, a thin, deep oxide layer.

The resulting wafer can advantageously be used for producing integrated micro-electronic circuits, sensors of different types (e.g., pressure, gas, temperature etc.), and micro-integrated mechanical structures such as gyroscopes, micromotors and so on.

The advantages of the described method are immediately apparent to those skilled in the art from the preceding description. In particular, it is emphasized that the described embodiment of the invention produces a covered oxide layer using only process steps which are well known and already in use in integrated circuit production, with costs which are much lower than those of the processes currently used for production of SOI substrates. In addition, as indicated, it is possible to adapt the dimensions and thus the electrical features of SOI wafer to specific applications, similar to known SOI processes.

However, the above-described embodiment of the invention has the disadvantage that during the non-masked anisotropic etching step, oxide portions are uncovered, and therefore may give rise to areas having crystallographic defects during the subsequent epitaxial step. In particular, as shown in greater detail in FIG. 13 with reference to a single initial trench 10, growth of the second oxide layer 11 takes place inter alia towards the interior of initial trench 10, forming steps 39. Consequently, when the second silicon nitride layer 12 is deposited, it follows the inner profile of the lateral walls of initial trenches 10, and thus in turn forms a pair of steps 40 in each initial trench 10.

The presence of these steps 39, 40 causes, in the subsequent non-masked anisotropic etching of layers 12 and 11, removal not only of the horizontal portions of the second silicon nitride layer 12 and the second oxide layer 11 on the bottom of initial trenches 10 and above portions 4a and 5a, but also of portions of the second silicon nitride layer 12 forming the steps 40, thus possibly leaving uncovered the portions of the second oxide layer 11 which form the steps 39, as shown in FIG. 14.

Consequently, as shown in FIG. 15, in the subsequent oxidation step for growing buried oxide region 22, there is undesirable growth of silicon oxide at the steps 39, forming oxide areas 41. These oxide areas 41 may cause, in the subsequent epitaxial growth step, growing of defective areas in the epitaxial layer 23, delimited in FIG. 16 by broken lines.

In order to eliminate crystallographic defects present in the epitaxial layer, according to a second embodiment of the present invention the method of etching the second portions 2b of monocrystalline silicon region 2 is modified by preceding the anisotropic etching by an isotropic etching, so as to appropriately shape the initial trenches 10 near surface 3 of monocrystalline silicon region 2.

Figure 17:
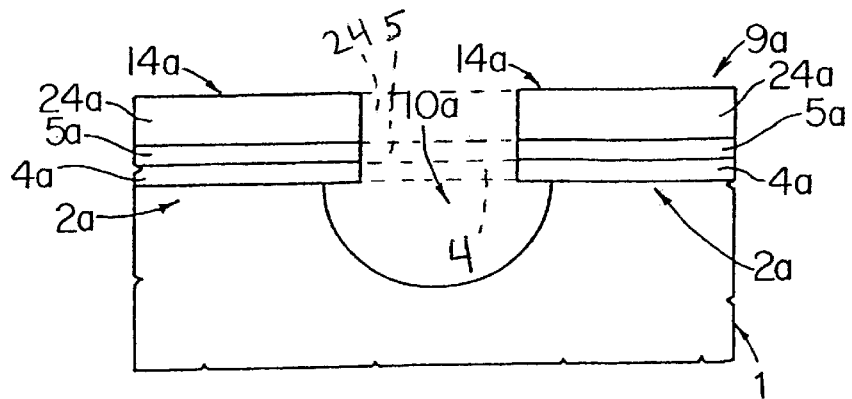
FIGS. 17–19 show cross-sections of an SOI wafer during manufacturing processes according to a second embodiment of the present invention.

As shown in FIG. 17, a TEOS (tetraethylorthosilicate) oxide layer 24 is deposited on the first nitride layer 5, the TEOS oxide layer 24 having a thickness comprising for example, between 5000 and 7000 Å, and preferably 6000 Å. Sections of the TEOS oxide layer are selectively removed, leaving portions 24a of the TEOS oxide layer 24. This may be accomplished by ways known to those skilled in the art. The TEOS oxide layer portions 24a, together with the remaining portions 5a, 4a of the first nitride layer 5 and the first oxide layer 4, form the hard mask 9a.

Using hard mask 9a, the second portions 2b of monocrystalline silicon region 2 are isotropically etched to form partial trenches 10a. In particular, partial trenches 10a are approximately cup-shaped, and have a depth of typically 0.4–0.6 µm, preferably being 0.5 µm. Owing to the etching isotropy, part of first portions 2a of monocrystalline silicon region 2 is also removed below first protective regions 14a in FIG. 13, defined by hard mask 9a.

TEOS portions 24a protect oxide portions 4a and silicon nitride portions 5a. Isotropic etching is preferably carried out using a mixture of $NF_3$ and Ar in the following conditions: supply flow of $NF_3$ and Ar of 8 sccm (standard cube centimetres per minute) and 50 sccm, pressure of 250 mT, power of 500 W and magnetic field of 50 Gauss. Other mixtures and conditions may also be used as appropriate.

Figure 18:
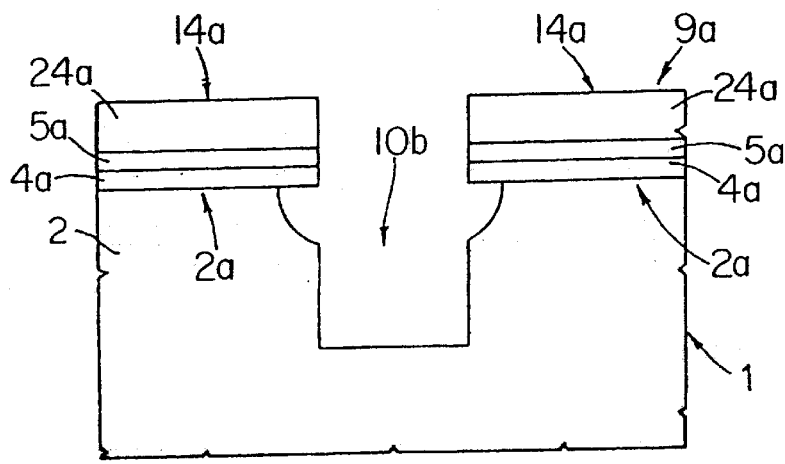

Referring to FIG. 18, immediately after isotropic etching, without removing the wafer 1 from the treatment chamber, non-masked anisotropic etching similar to that previously described with reference to FIG. 2 is carried out. Anisotropic etching is advantageously carried out using a mixture of HBr, $NF_3$, $He/O_2$ and $SiF_4$, in the following conditions: supply flow of HBr, $NF_3$, $He/O_2$ and $SiF_4$ respectively of 32 sccm, 5 sccm, 8 sccm and 3 sccm, pressure of 125 mT, power of 650 W and magnetic field of 60 Gauss. Again, other mixtures and conditions may be used as appropriate. This etching thus gives rise to an increase in the depth of partial trenches 10a in the vertical direction only, forming initial trenches 10b. At the end, initial trenches 10b typically have an overall depth of between 0.6 and 4 µm, depending on the characteristics required for the buried oxide layer to be produced. Greater or lesser depths may also be used as appropriate.

Consequently, initial trenches 10b obtained after the isotropic and anisotropic etchings are approximately funnel-like shaped.

Figure 19:
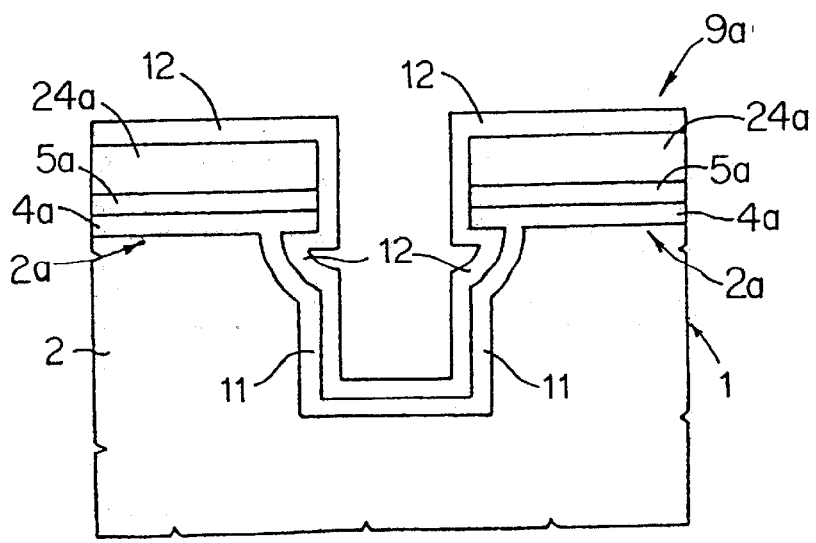

After anisotropic etching, without making any modifications, wafer 1 is oxidized to form the second oxide layer 11 covering the walls and the bottom of initial trenches 10b, and the second silicon nitride layer 12 is deposited as previously described, thus obtaining the intermediate structure shown in FIG. 19.

Figure 8:
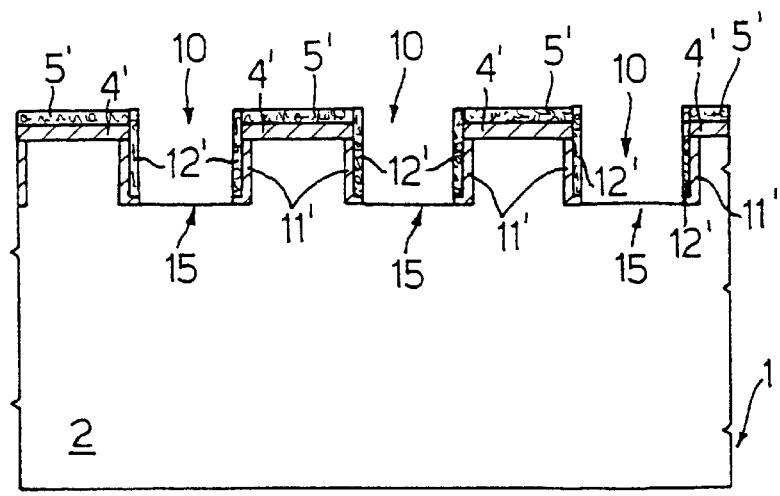

The previously described processes with reference to FIGS. 7–8 are then carried out to form final trenches 16 (which are typically 1–4 µm deeper than the initial trenches 10"), to form buried oxide region 22, and to grow epitaxial layer 23.

Therefore, when the layers 11, 12 are formed, no steps 39, 40 (FIG. 13) are formed projecting towards the interior of the initial trenches 10b, and the subsequent non-masked anisotropic etching of layers 11, 12 does not uncover oxide portions of layer 11, thus preventing the potential problem described above with reference to FIG. 16.

Consequently, the described embodiment of the invention makes it possible to produce an epitaxial layer 23 with a drastic reduction of the number of crystallographic defects, and thus produce SOI wafers having distinctly better electrical features than the SOI substrate according to the first embodiment, at costs which are much lower than those of the methods currently used for production of substrates of this type.

Finally, it is apparent that many modifications and variants can be made to the described and illustrated processes, all of which come within the scope of the invention, as defined in the attached claims. In particular it is stressed that the deep oxide region can cover all or virtually all of wafer 1, forming a complete layer, or it can extend to only one or a plurality of predetermined wafer areas in order to form a selective SOI substrate on the basis of the requirements of the components to be integrated in the epitaxial layer or the final structure to be obtained from the substrate. In addition, it is stressed that the shape of mask 6, and thus of monocrystalline silicon regions which are subjected to oxidation to form covered oxide layers, can vary, as indicated above and as appropriate.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for manufacturing an SOI wafer, comprising:
    on a wafer of monocrystalline semiconductor material,
        forming first protective regions of an oxidation resistant material, covering first wafer portions;

forming deep trenches in said wafer, extending between and laterally delimiting a plurality of columns in said first wafer portions, the columns being monocrystalline semiconductor material that is continuously crystalline with monocrystalline semiconductor material positioned below the columns;

after forming said deep trenches, oxidizing completely said columns, except upper portions of said columns to form at least one continuous region of covered oxide that completely fills the deep trenches except for portions of the trenches between the first protective regions, the continuous region of covered oxide being overlaid by said nonoxidized upper portions that are covered by said first protective regions;

removing said first protective regions; and epitaxially growing a continuous monocrystalline semiconductor material layer from said upper portions, said semiconductor material layer extending uninterruptedly above said upper portions and into said deep trenches.

2. The method according to claim 1 wherein said first protective regions have the shape of an overturned U.

3. The method according to claim 2 wherein forming said first protective regions comprises:

forming a first mask of said oxidation resistant material, on an upper surface of said wafer;

in said wafer, excavating second wafer portions which are not covered by said first mask to form first initial trenches extending between said first wafer portions;

forming vertical lateral protective walls of non-oxidizable material laterally covering said upper portions, and forming, with said first mask, said overturned U shape.

4. The method according to claim 3, wherein said step of forming a first mask comprises:

forming a first oxide layer;

depositing a first nitride layer on said first oxide layer; and removing selective portions of said first oxide and nitride layers.

5. The method according to claim 3 wherein forming vertical lateral protective walls comprises:

forming a second oxide layer covering base walls and lateral walls of said first initial trenches;

depositing a second nitride layer on said second oxide layer; and anisotropically etching said second oxide and nitride layers.

6. The method according to claim 1 wherein said deep trenches extend along parallel strips.

7. The method according claim 1 wherein said deep trenches form a grid.

8. The method according to claim 1, further comprising before said oxidation of said first wafer portions, angle implanting doping ionic species.

9. The method according to claim 1, wherein forming first protective regions comprises forming local oxide regions buffered with polycrystalline silicon.

10. The method according to claim 1 wherein forming said deep trenches comprises:

isotropically etching second wafer portions between said first wafer portions to form first initial trenches extending also partially into said first wafer portions below said first protective regions; and anisotropically etching said wafer below said first initial trenches to form second initial trenches, which are disposed between said second wafer portions, said first and second initial trenches together comprising said deep trenches.

11. The method according to claim 10 wherein said first initial trenches are substantially cup-shaped in a cross-sectional view.

12. The method according to claim 10 wherein said deep trenches are substantially funnel-like shaped in a cross-sectional view.

13. The method according to claim 10 wherein forming first protective regions comprises:

forming a first oxide layer;

forming a nitride layer above said first oxide layer;

forming a second oxide layer above said nitride layer; and removing selective portions of said first and second oxide layers and said nitride layer.

14. The method according to claim 13 wherein said second oxide layer is a tetraethylorthosilicate oxide layer.

15. The method of claim 1 wherein epitaxially growing said semiconductor material layer comprises epitaxially growing said semiconductor material layer in said deep trenches between said upper portions.

16. A method for manufacturing an SOI wafer, comprising:

on a wafer of monocrystalline semiconductor material, forming first protective regions of an oxidation resistant material, covering first wafer portions;

isotropically etching second wafer portions between said first wafer portions to form first initial trenches extending also partially into said first wafer portions below said first protective regions;

anisotropically etching said wafer below said first initial trenches to form second initial trenches that are continuous with the first initial trenches;

forming second protective regions on sidewalls of the first wafer portions which define the first and second initial trenches;

after forming the second protective regions, anisotropically etching said wafer below said second initial trenches to form final trenches that include the first and second initial trenches, the final trenches extending between and laterally defining a plurality of columns in said first wafer portions, the columns including lower sidewalls that are not protected by the second protective regions;

the columns being monocrystalline semiconductor material that is continuously crystalline with monocrystalline semiconductor material positioned below the columns before epitaxially growing monocrystalline semiconductor material from said columns, oxidizing completely said columns, except upper portions of said columns to form a continuous region of covered oxide overlaid by said non-oxidized upper portions that are covered by said first protective regions;

removing said first protective regions; and epitaxially growing a continuous monocrystalline semiconductor material layer from said upper portions after the oxidizing step, said semiconductor material layer extending uninterruptedly above said upper portions and into said deep trenches.

17. The method of claim 16 wherein the epitaxial layer extends continuously over the insulating material in the trenches and over the surface of the monocrystalline semiconductor wafer.

18. The method of claim 16 wherein the trenches form a grid.

19. The method of claim 16, further comprising:

forming a protective cap of an oxidation resistant material overlaying the first and second protective regions adjacent to the upper portions of the trenches while leaving the lower sidewalls of the columns unprotected by the protective cap; and removing the protective cap after oxidizing the lower sidewalls of the columns.

20. A method for forming a silicon-on-insulator wafer from a monocrystalline semiconductor wafer, comprising:

forming a first protective layer overlaying the monocrystalline semiconductor wafer;

selectively removing portions of the first protective layer to expose first portions of the monocrystalline semiconductor wafer;

selectively removing the exposed first portions of the monocrystalline semiconductor wafer to form initial trenches, each initial trench having side walls and a bottom;

forming a second protective layer on the side walls of the initial trenches, the first and second protective layers jointly surrounding second portions of the monocrystalline semiconductor wafer on three sides and leaving exposed third portions of the monocrystalline semiconductor wafer at the bottom of each initial trench;

selectively removing the exposed third portions of the monocrystalline semiconductor wafer to form final trenches, the final trenches extending only partially through the monocrystalline semiconductor wafer;

the final trenches defining a plurality of columns in the monocrystalline semiconductor wafer, the columns being monocrystalline semiconductor material that is continuously crystalline with monocrystalline semiconductor material positioned below the columns oxidizing fourth portions of the monocrystalline semiconductor wafer between the final trenches to form an insulating material, the insulating material completely filling the trenches up to a level immediately adjacent to the first and second protective layers;

removing the first and second protective layers; and growing an epitaxial layer of crystalline semiconductor material seeded from the second portions of the monocrystalline semiconductor wafer, the epitaxial layer overlaying the insulating material and extending in the final trenches between the second portions.

21. The method of claim 20 wherein forming the second protective layer on the walls of the initial trenches comprises:

forming a second protective layer on the walls and bottom of the trenches and overlaying the first protective layer; and selectively removing portions of the second protective layer that overlay the first protective layer, and selectively removing the second protective layer from the bottom of the trenches to expose the third portions of the monocrystalline semiconductor wafer.

22. The method of claim 20 wherein forming the second protective layer comprises:

oxidizing the portions of the monocrystalline semiconductor wafer adjacent to the trenches to form an oxide layer;

depositing a layer of silicon nitride on the first protective layer and oxide layer;

anisotropically etching portions of the oxide layer and silicon nitride layer to remove portions of the silicon nitride and oxide layers, the anisotropical etching leaving the silicon nitride layer and oxide layer on the walls of the trenches, and exposing the third portions of the monocrystalline silicon wafer.

23. The method of claim 20 wherein the initial trenches are funnel shaped in a cross-sectional view.

24. The method of claim 20 wherein forming the first protective layer comprises:

growing a first oxidized layer on the surface of the monocrystalline semiconductor wafer;

depositing a layer of silicon nitride over the first oxidized layer;

forming a mask overlaying portions of the silicon nitride layer; and etching the silicon nitride layer and the first oxidized layer not overlaid by the mask.

25. The method of claim 24, further comprising:

depositing a layer of TEOS on the layer of silicon nitride;

selectively removing portions of the TEOS layer to expose a portion of monocrystalline semiconductor wafer; and isotropically etching the exposed portion of the wafer to form partial, semicircular trenches that extend under portions of the first oxidized layer.

26. The method of claim 20 wherein the epitaxial layer extends continuously over the insulating material in the final trenches and over the second portions of the monocrystalline semiconductor wafer.

* * * * *